United States Patent
Koradia et al.

(10) Patent No.: US 6,395,976 B1
(45) Date of Patent: *May 28, 2002

(54) APPARATUS AND METHOD FOR ALIGNING A CIRCUIT BOARD ASSEMBLY IN AN ELECTRONIC CHASSIS

(75) Inventors: Amir Koradia, Palatine; Kisuck Chung, Bloomingdale; Philip A. Ravlin, Bartlett; Douglas J. Pogatetz, Mount Prospect, all of IL (US)

(73) Assignee: 3Com Corporation, Rolling Meadows, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,831

(22) Filed: Aug. 31, 1998

(51) Int. Cl.[7] .................................................. H05K 9/00
(52) U.S. Cl. ............................... 174/35 GC; 174/35 R; 361/800; 361/797; 361/801
(58) Field of Search ................................ 361/802, 799, 361/800, 801, 796, 797; 174/35 R, 35 GC

(56) References Cited

U.S. PATENT DOCUMENTS 4,631,641 A * 12/1986 Brombal et al. ............ 361/818
5,233,507 A * 8/1993 Gunther et al. ............. 361/818
5,402,320 A * 3/1995 Kielstra et al. ............. 361/796
6,078,504 A * 6/2000 Miles ......................... 361/727

* cited by examiner

Primary Examiner—Dean A. Reichard
Assistant Examiner—Hung V Ngo
(74) Attorney, Agent, or Firm—Baniak Pine & Gannon

(57) ABSTRACT

An apparatus for aligning a bracket member of a circuit board assembly as the bracket member is positioned against and secured to an electronic chassis is provided. A circuit board assembly includes a circuit board operatively attached to a bracket member. The bracket member includes a first end, a second end, an outer surface and an inner surface. A gasket is longitudinally oriented along the outer surface of the bracket member. A first pin extends from the inner surface adjacent the first end, and a second pin extends from the inner surface adjacent the second end. An electronic chassis includes a top flange and a bottom flange. The top flange includes a top flange opening and the bottom flange includes a bottom flange opening. The first pin is aligned with and extends through the top flange opening and the second pin is aligned with and extends through the bottom flange opening to align the bracket member as the bracket member is positioned against and secured to the electronic chassis.

10 Claims, 4 Drawing Sheets

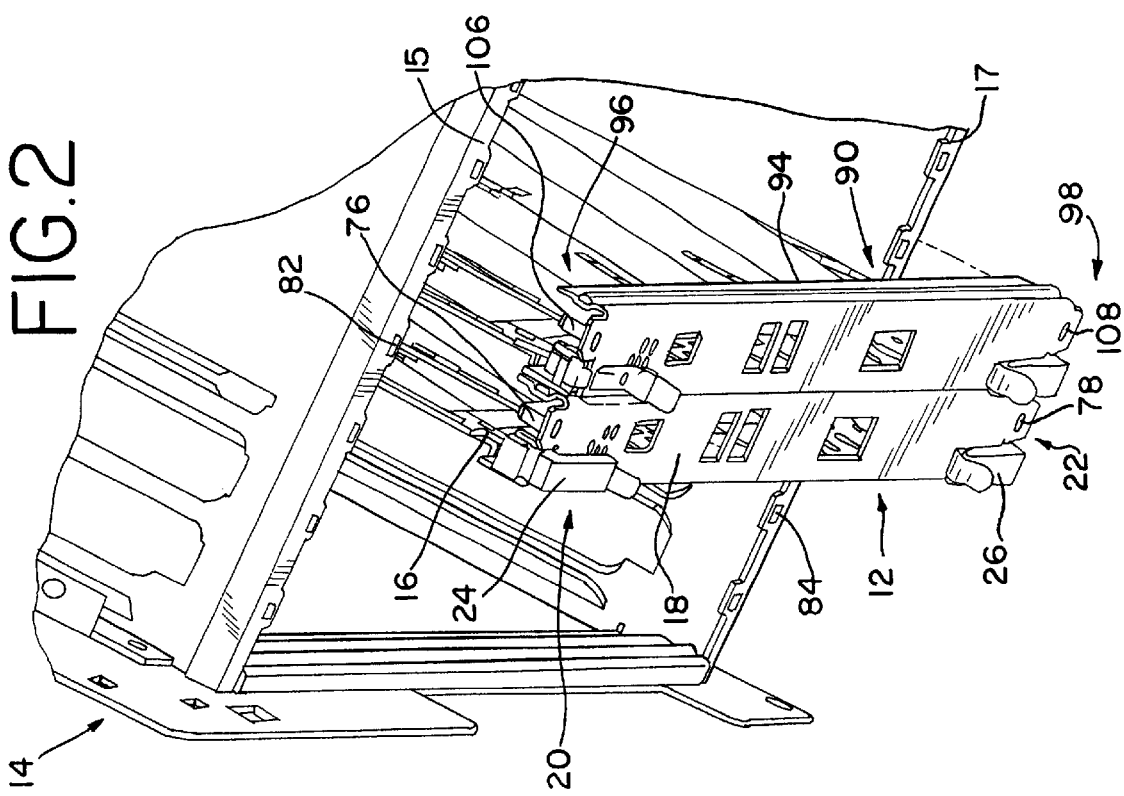
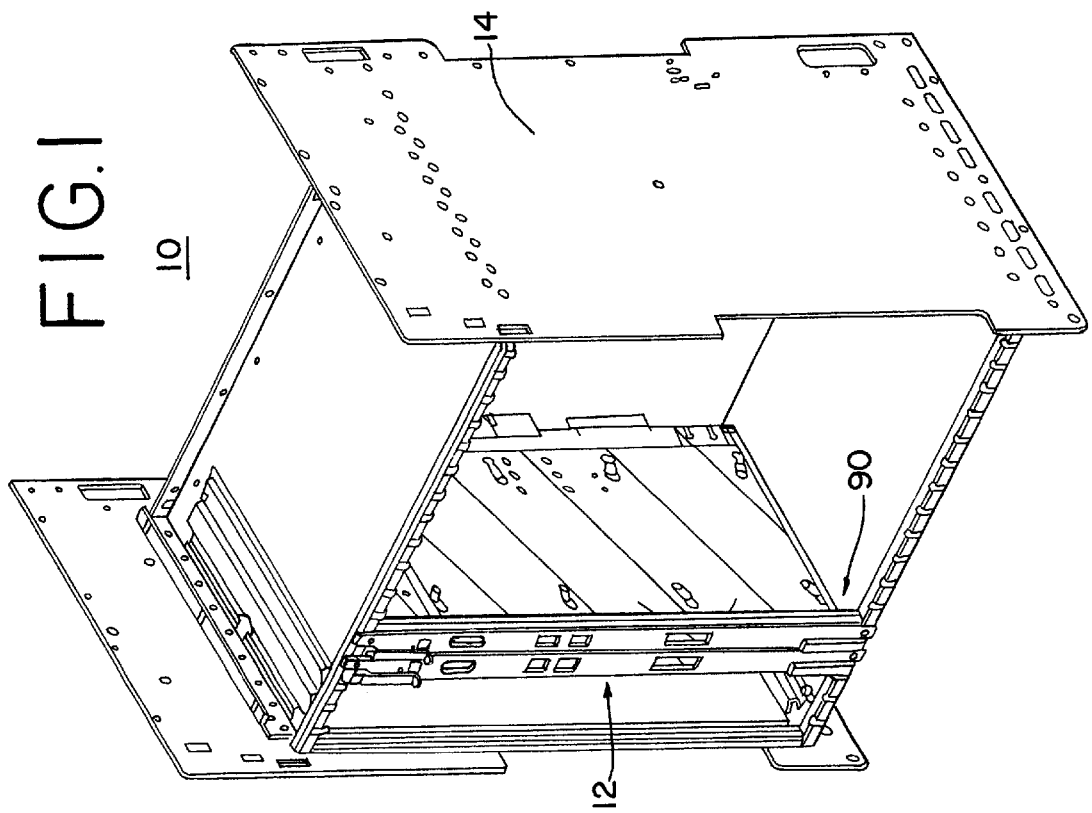

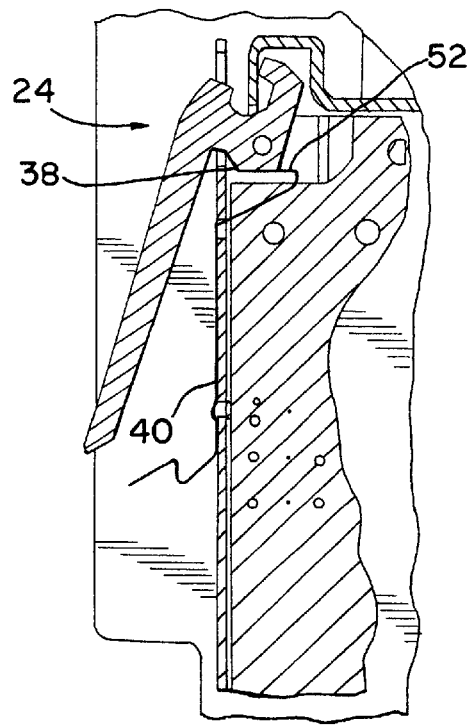
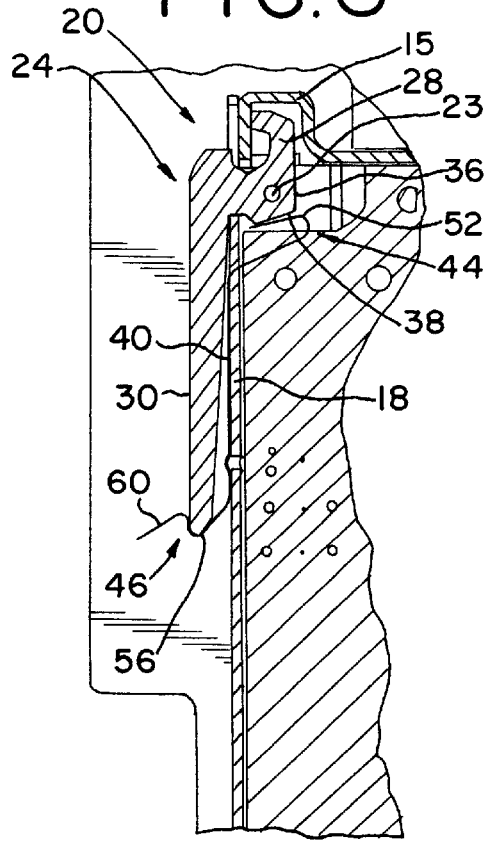
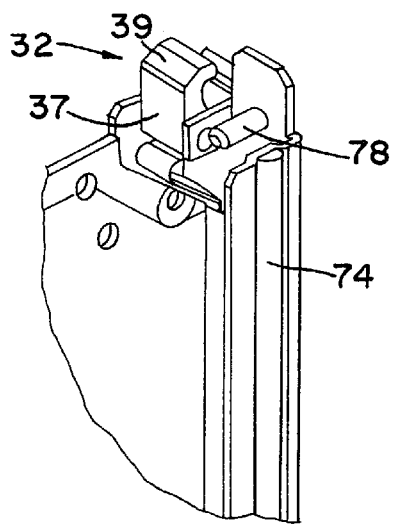
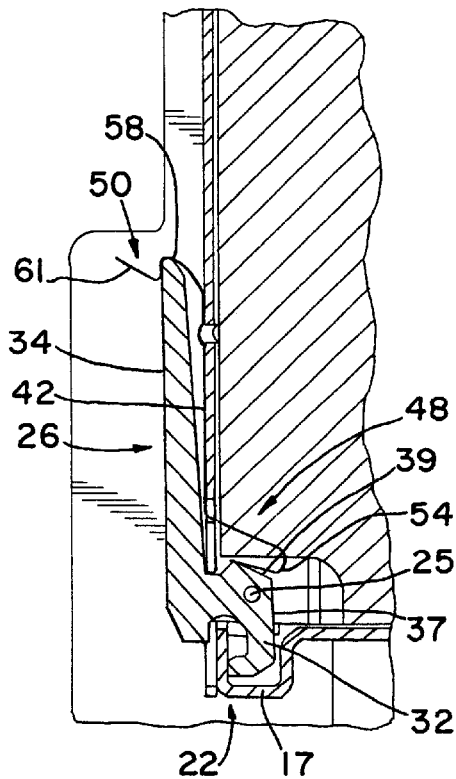

APPARATUS AND METHOD FOR ALIGNING A CIRCUIT BOARD ASSEMBLY IN AN ELECTRONIC CHASSIS

FIELD OF THE INVENTION

This invention relates generally to the field of mounting brackets and in particular, to an apparatus and method for aligning a bracket member of a circuit board assembly as the bracket member is positioned against and secured to an electronic chassis.

BACKGROUND OF THE INVENTION

An electronic chassis which houses electronic components for high speed telecommunication and networking applications typically includes a plurality of vertically oriented circuit board assemblies that are inserted into the chassis. Each circuit board assembly is typically comprised of a circuit board attached to a vertically oriented U-shaped channel member that serves as a front faceplate of the assembly. When the assembly is fully inserted, the circuit board is connected to a backplane printed circuit located along the backside of the chassis. The insertion force required to connect the circuit board to the backplane may make it difficult, if not impossible, for a technician to make the connection by manually forcing the channel member in a direction towards the backplane.

In order to facilitate the connection of the circuit board to the backplane, a lever having a handle portion and a hook portion is typically provided at each end of the channel member. Each lever is typically rotatably attached to each end of the channel member and is able to rotate about a pin that is attached to the channel member. When installing the circuit board assembly, a technician orients each hook portion to allow each hook portion to engage a flange portion of the chassis when the channel member is pushed in the direction of the backplane. After the hook portion engages the flange portion, the handle portion of each lever is then manually rotated about the pin, which forces the circuit board into the backplane.

Each channel member typically includes a gasket that is longitudinally oriented along the entire length of one of the sides of the channel member. When the circuit board assemblies are installed, the gasket of one channel member is positioned against one side of an adjacent channel member. The function of the gasket is to prevent electromagnetic emissions from exiting the chassis between two adjacent channel members. It is therefore critical that there be a proper amount of gasket compression along the entire length of the bracket member to ensure uniform electromagnetic interference shielding along the entire length of the bracket member. Moreover, since the plurality of circuit board assemblies in the chassis are in close proximity to one another, it is critical for each circuit board assembly to be properly aligned. This insures that the insertion force and the extraction force for each assembly is uniform so that the desired number of assemblies can be inserted into the chassis.

With conventional circuit board assemblies, the channel member is typically fastened to the chassis with conventional mechanical fastening components such as, for example, spring-loaded screws or bolts. The disadvantage of his arrangement is that each channel member must be aligned manually before the channel member is fastened to the chassis. However, it is extremely difficult to manually align each assembly to provide uniform gasket compression. Moreover, with mechanical fasteners, the tolerance between parts may result in the inconsistent placement of the channel members which may result in inconsistent gasket compression. This in turn may allow unacceptable levels of electromagnetic emissions to exit the chassis.

Accordingly, it would be desirable to have an apparatus for aligning a circuit board assembly to an electronic chassis that overcomes the disadvantages described above.

SUMMARY OF THE INVENTION

One aspect of the invention provides an apparatus for aligning a bracket member of a circuit board assembly as the bracket member is positioned against and secured to an electronic chassis. A circuit board assembly includes a circuit board operatively attached to a bracket member. The bracket member includes a first end, a second end, an outer surface, and an inner surface. A gasket is longitudinally oriented along the outer surface of the bracket member. A first pin extends from the inner surface adjacent the first end, and a second pin extends from the inner surface adjacent the second end. An electronic chassis includes a top flange and a bottom flange. The top flange includes a top flange opening, and the bottom flange includes a bottom flange opening. The first pin is aligned with and extends through the top flange opening and the second pin is aligned with and extends through the bottom flange opening to align the bracket member as the bracket member is positioned against and secured to the electronic chassis. The bracket member may preferably be a U-shaped channel member. The first and second pins each may preferably include a tapered end portion. Each of the first and second pins may preferably be approximately 0.125 inches in diameter and 0.400 inches in length. The gasket may preferably be comprised of a metallic material that prohibits the transmission of electromagnetic emissions. The top flange opening may preferably be a slot. The bottom flange opening may also preferably be a slot.

Another aspect of the invention provides an apparatus for providing uniform electromagnetic interference shielding between two adjacent circuit board assemblies. A first circuit board assembly includes a first circuit board operatively attached to a first bracket member. The first bracket member includes a first end, a second end, an outer surface and an inner surface. The first bracket member includes an electromagnetic interference gasket longitudinally oriented along a length of the outer surface. A first pin extends from the inner portion adjacent the first end, and a second pin extends from the inner portion adjacent the second end. A second circuit board assembly includes a second circuit board operatively attached to a second bracket member. The second bracket member includes a first end, a second end, an outer surface and an inner surface. The second bracket member includes an electromagnetic interference gasket longitudinally oriented along a length of the outer surface. A first pin extends from the inner portion adjacent the first end, and a second pin extends from the inner portion adjacent the second end. An electronic chassis includes a top flange and a bottom flange. The top flange includes a top flange opening and a second top flange opening, the bottom flange including a bottom flange opening and a second bottom flange opening. The electromagnetic interference gasket of the first bracket member is positioned against the outer surface of the second bracket member. The first pin of the first bracket member is aligned with and extends through the top flange opening and the second pin of the first bracket member is aligned with and extends through the bottom flange opening. The first pin of the second bracket member is aligned with and extends through the second top flange opening. The second pin of the second bracket member is aligned with and extends through the second bottom flange opening to evenly compress the electromagnetic interference gasket of the first bracket member with the second bracket member and provide uniform electromagnetic interference shielding along the length of the first and second bracket members.

Another aspect of the invention provides a method for aligning a bracket member of a circuit board assembly as the bracket member is positioned against and secured to an electronic chassis. A circuit board assembly including a circuit board operatively attached to a bracket member is provided. The bracket member includes a first end, a second end, an outer surface, and an inner surface. A gasket is longitudinally oriented along the outer surface of the bracket member. A first pin extends from the inner surface adjacent the first end, and a second pin extends from the inner surface adjacent the second end. An electronic chassis includes a top flange and a bottom flange. The top flange includes a top flange opening and the bottom flange including a bottom flange opening. The first pin is aligned with the top flange opening and the second pin is aligned with the bottom flange opening. The first pin extends through the top flange opening and the second pin extends through the bottom flange opening. The bracket member is aligned as the bracket member is positioned against and secured to the electronic chassis.

Another aspect of the invention provides a method for providing uniform electromagnetic interference shielding between two adjacent circuit board assemblies. A first circuit board assembly including a first circuit board operatively attached to a first bracket member is provided. The first bracket member includes a first end, a second end, an outer surface and an inner surface. The first bracket member includes an electromagnetic interference gasket longitudinally oriented along a length of the outer surface. A first pin extends from the inner portion adjacent the first end and a second pin extends from the inner portion adjacent the second end. A second circuit board assembly includes a second board operatively attached to a second bracket member. The second bracket member including a first end, a second end, an outer surface and an inner surface. The second bracket member includes an electromagnetic interference gasket longitudinally oriented along a length of the outer surface. A first pin extends from the inner portion adjacent the first end, and a second pin extends from the inner portion adjacent the second end. An electronic chassis includes a top flange and a bottom flange. The top flange includes a top flange opening and a second top flange opening. The bottom flange includes a bottom flange opening and a second bottom flange opening. The electromagnetic interference gasket of the first bracket member is contacted with the outer surface of the second bracket member. The first pin of the first bracket member is aligned with the top flange opening and the second pin of the first bracket is aligned with the bottom flange opening. The first pin of first bracket extends through the top flange opening and the second pin of the first bracket member extends through the bottom flange opening. The first pin of the second bracket member is aligned with the second top flange opening and the second pin of the second bracket is aligned with the second bottom flange opening. The first pin of second bracket extends through the second flange opening and the second pin of the second bracket member extends through the second bottom flange. The electromagnetic interference gasket of the first bracket member is compressed with the outer surface of the second bracket member. Uniform electromagnetic interference shielding is provided along the length of the first and second bracket members.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWING

FIG. 1 is a perspective view of a preferred embodiment of an apparatus for mounting a circuit board assembly to an electronic chassis that is made in accordance with the invention;

FIG. 2 is a partial exploded view of a preferred embodiment of an apparatus for mounting a circuit board assembly to an electronic chassis;

FIG. 7 is a sectional view of the first connector member of FIG. 6 in the intermediate position;

FIG. 8 is a sectional view of a preferred embodiment of a first connector member and a second connector member in the locked position; and FIG. 9 is an enlarged partial perspective view of a preferred embodiment of a circuit board assembly.

DETAILED DESCRIPTION OF THE PRESENTLY PREFERRED EMBODIMENTS

Figure 3:
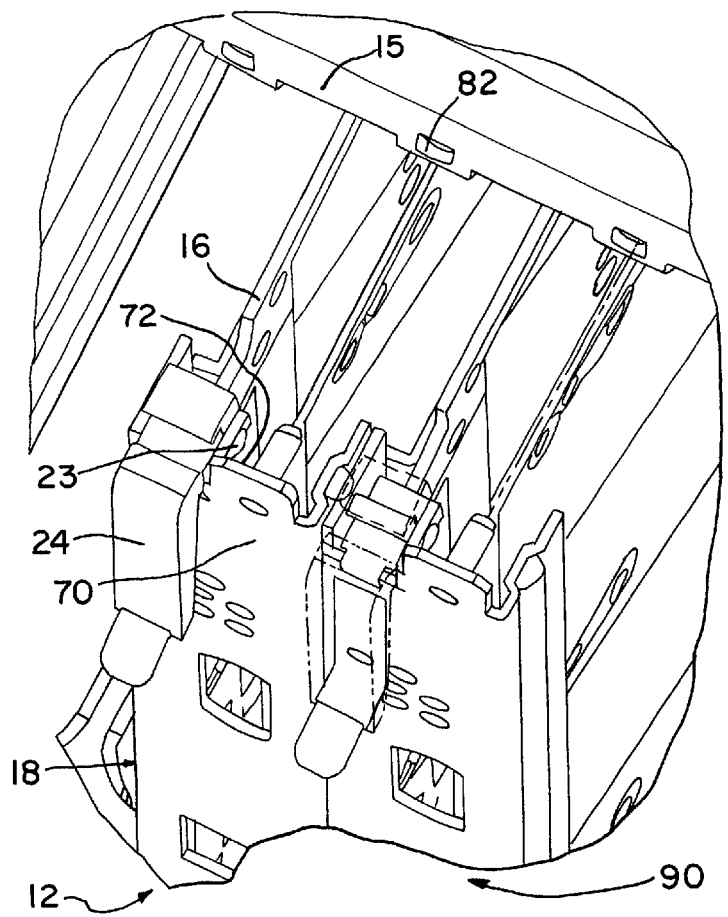
FIG. 3 is an enlarged partial exploded view of the embodiment of FIG. 2.
Figure 4:
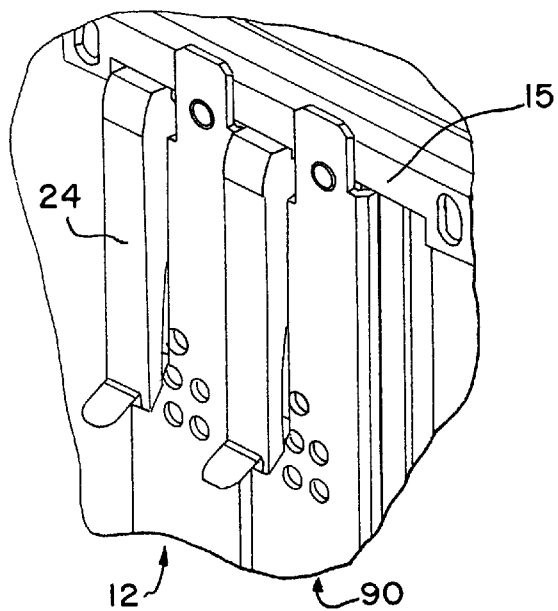
FIG. 4 is an enlarged partial perspective view of a preferred embodiment of a first circuit board assembly and a second circuit board assembly mounted to an electronic chassis.
Figure 5:
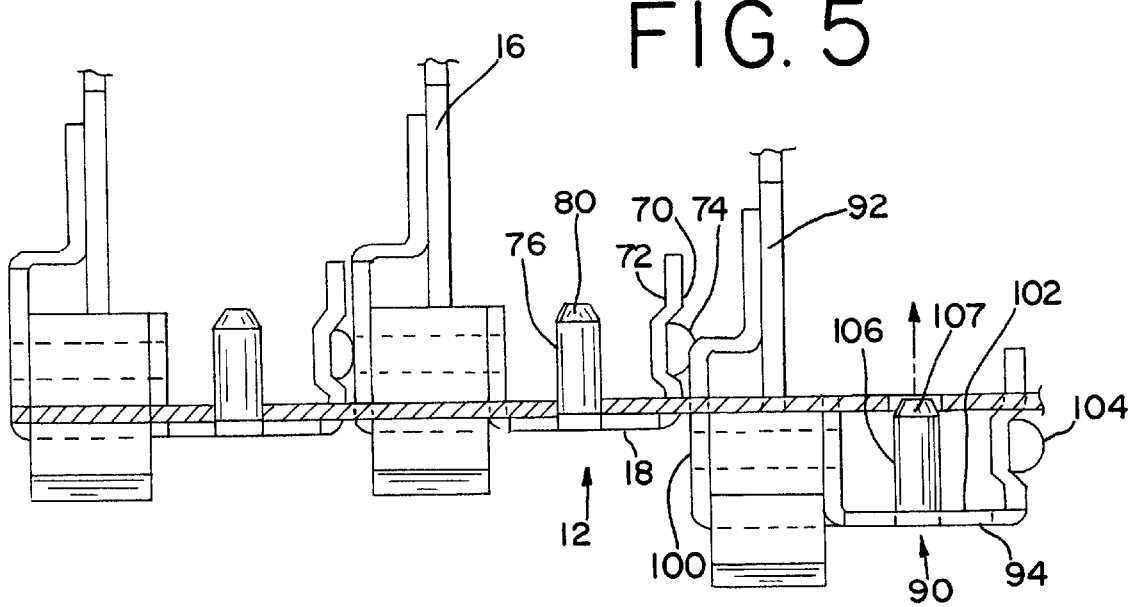
FIG. 5 is a sectional top view of a preferred embodiment showing a first circuit board assembly mounted to an electronic chassis and a second circuit board assembly being inserted into the electronic chassis.

As shown in FIGS. 1–9, a preferred embodiment of an apparatus 10 for mounting a circuit board assembly to an electronic chassis and for aligning the circuit board assembly in the electronic chassis includes a circuit board assembly 12 and an electronic chassis 14. Referring to FIG. 5, the circuit board assembly 12 includes a circuit board 16 operatively attached to a bracket member 18. The circuit board 16 may preferably be attached to the bracket member 18 with conventional fasteners such as, for example, rivets, screws, or bolts. The circuit board 16 may be any conventional printed circuit board. As shown in FIGS. 2 and 3, the bracket member 18 may preferably be a U-shaped channel member, although various shapes and configurations are contemplated. The bracket member 18 may be comprised of plastic or steel, or any other suitable rigid metallic or non-metallic material. As shown in FIG. 2, the bracket member 18 includes a first end 20 and a second end 22. A first connector member 24 is rotatably attached to first end 20 of the bracket member 18. As shown in FIG. 8, the first connector member 24 may preferably rotate about a pin 23. A second connector member 26 is rotatably attached to the second end 22 of the bracket member 18. In the embodiment shown, the second connector member 26 may also preferably rotate about a second pin 25.

In the embodiment shown in FIG. 8, the first connector member 24 includes a first hook portion 28 and a first handle portion 30. The second connector member 26 includes a second hook portion 32 and a second handle portion 34. The first hook portion 28 includes a first surface 36 and a second surface 38 oriented at an angle to the first surface 36. In the embodiment shown, the angle between the first surfaces 36 and the second surface 38 is preferably in a range between 90 degrees and 135 degrees. The second hook portion 32 also includes a first surface 37 and a second surface 39 oriented at an angle to the first surface 37. In the embodiment shown, the angle between the first surface 37 and the second surface 39 is preferably in a range between 90 degrees and 135 degrees.

As shown in FIG. 8, a first spring 40 is operatively attached to the bracket member 18 adjacent the first end 20 of the bracket member 18. A second spring 42 is operatively attached to the bracket member 18 adjacent the second end 22 of the bracket member 18. Conventional mechanical fasteners such as, for example, rivets, screws, bolts, and nuts may be used to attach the first and second springs 40, 42 to the bracket member 18. Alternatively, other conventional means may be used to fasten the first and second springs 40, 42 to the bracket member 18 including, for example, adhesives or spot welding. The first and second springs 40, 42 may each be manufactured from metal such as, for example, stainless steel, beryllium copper, or any other suitable material that can function as a spring. In the embodiment shown, the first and second springs 40, 42 may each preferably have a length of approximately 1.00 to 1.50 inches, a thickness of approximately 0.007 to 0.20 inches, and a width of approximately 0.187 to 0.250 inches. Alternatively, the first and second springs 40, 42 may have other dimensions depending upon the particular application.

Figure 6:
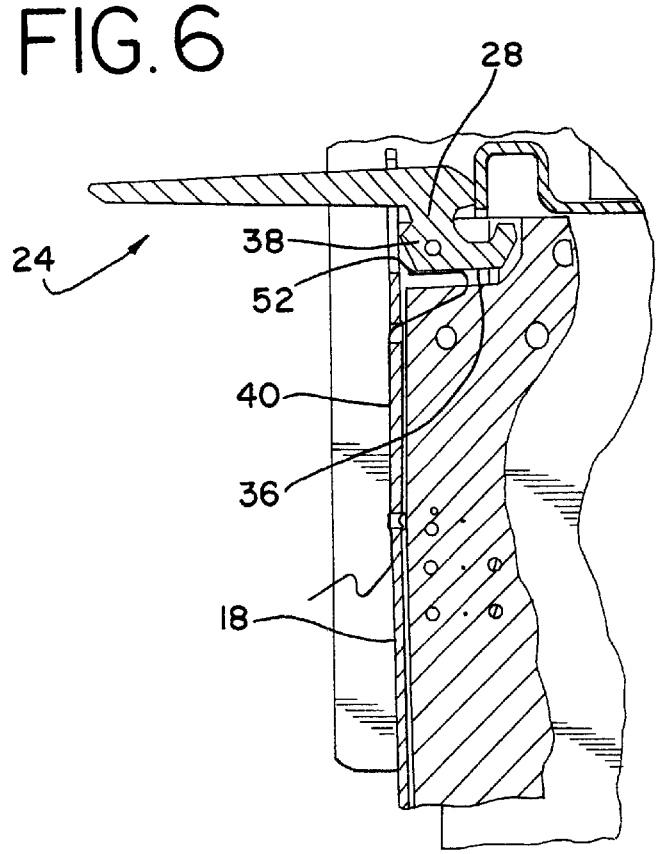
FIG. 6 is a sectional view of a preferred embodiment of a first connector member in an insertion position.

As shown in FIG. 8, the first spring 40 includes a first end portion 44 and a second end portion 46. The first end portion 44 of the first spring 40 includes a contact surface 52 which is in contact with the first hook portion 28. The first end portion 44 may preferably have a generally U-shaped configuration, although alternative shapes and configurations are contemplated. FIG. 6 shows the first connector member 24 in an insertion position. In this position, the contact surface 52 of the first spring 40 is biased against the first surface 36 of the first hook portion 28. FIG. 7 shows the first connector member 24 in an intermediate position. In this position, the contact surface 52 of the first spring 40 is biased against the second surface 38 of the first hook portion 28.

FIG. 8 shows the first and second connector members 24, 26 in a locked position. The second end portion 46 of the first spring 40 includes a latch portion 56 which receives the first handle portion 30 of the first connector member 24 when the first connector member 24 is in a locked position. When the first connector member 24 is in the locked position, the contact surface 52 of the first spring 40 is further biased against the second surface 38 of the first hook portion 28.

As shown in FIG. 8, the second spring 42 includes a first end portion 48 and a second end portion 50. The first end portion 48 of the second spring 42 includes a contact surface 54 in contact with the second hook portion 32. The first end portion 48 may preferably have a generally U-shaped configuration, although alternative shapes and configurations are contemplated. When the second connector member 26 is in an insertion position, the contact surface 54 of the second spring 42 is biased against the first surface 37 of the second hook portion 32. When the second connector member 26 in the intermediate position, the contact surface 54 of the second spring 42 is biased against the second surface 39 of the second hook portion 32. The second end portion 50 of the second spring 42 includes a latch portion 58 which receives the second handle portion 34 of the second connector member 26 when the second connector member 26 is in a locked position. When the second connector member 26 in the locked position, the contact surface 54 of the second spring 42 is further biased against the second surface 39 of the second hook portion 32. As shown in FIG. 8, the second end portions 46, 50 of the first and second springs 40, 42 each may preferably include a manually operable tab portion 60, 61.

As shown in FIGS. 2 and 3, the electronic chassis 14 includes a first flange portion 15 and a second flange portion 17. In the embodiment shown, the first flange portion 15 extends from one side of the electronic chassis 14 to the other side adjacent the top of the electronic chassis 14. The second flange portion 17 extends from one side of the electronic chassis 14 to the other side adjacent the bottom of the electronic chassis 14. The electronic chassis 14 may be any suitable metal enclosure for housing various electronic components that carry out various functions such as, for example, telecommunications and networking functions. The electronic chassis 14 may preferably be comprised of any suitable rigid metal including, for example, steel.

To mount the circuit board assembly 12 to the electronic chassis 14, a technician positions the first and second connector members 24, 26 in the insertion position. The biasing of the contact surface 52 of the first spring 40 against the first surface 36 of the first hook portion 28 maintains the first connector member 24 in the insertion position. Similarly, the biasing of the contact surface 54 of the second spring 42 against the first surface 37 of the second hook portion 32 maintains the second connector member 26 in the insertion position. The circuit board 16 of the circuit board assembly 12 is inserted into the electronic chassis 14. When the circuit board assembly 12 is almost fully inserted, the first and second hook portions 28, 32 of the first and second connector members 24, 26 engage the flange portions 15, 17 of the electronic chassis 14. The first and second connector members 24, 26 may preferably be rotated to the intermediate position. This may be accomplished automatically as a result of a technician applying a force to the bracket member 18 in a direction toward the electronic chassis 14 which forces the first and second hook portions 28, 32 against the flange portions 15, 17 thereby causing the rotation of the first and second connector members 24, 26. Alternatively, the first and second connector members 24, 26 may be rotated to the intermediate position by a technician manually moving the first handle portion 30 in a downward direction toward the bracket member 18 and manually moving the second handle portion 34 in an upward direction toward the bracket member 18. When the first connector member 24 is in the intermediate position, the biasing of the contact surface 52 of the first spring 40 against the second surface 38 of the first hook portion 28 maintains the first connector member 24 in the intermediate position. Similarly, when the second connector 26 is in the intermediate position, the biasing of the contact surface 54 of the second spring 42 against the second surface 38 of the second hook portion 32 maintains the second connector member 26 in the intermediate position.

The first and second connector members 24 are further rotated to the locked position. This may be accomplished by a technician manually moving the first handle portion 30 in a downward direction toward the bracket member 18 and manually moving the second handle portion 34 in an upward direction toward the bracket member 18. When the first and second connector members 24, 26 are in the locked position, the first handle portion 30 of the first connector 24 is engaged with the latch portion 56 of the first spring 40. Similarly, the second handle portion 34 of the second connector 26 is engaged with the latch portion 50 of the second spring 42. An advantage of this arrangement is that a technician does not have to hold each of the connector members 24, 26 in the insertion position while the circuit board assembly 12 is being inserted into the electronic chassis 14. Also, no separate mechanical fasteners are required to secure the circuit board assembly 12 to the electronic chassis 14. This reduces manufacturing costs and minimizes the time required to install the circuit board assembly.

To remove the circuit board assembly 12 from the electronic chassis 14, a technician may first, for example, press the tab portion 60 of the first spring 40 to unlock the first handle portion 30 of the first connector member 24. The first end 44 of the first spring 40 unloads which causes the first connector member 24 to rotate out of the locked position. The technician may then press the tab portion 61 of the second spring 42 to unlock the second handle portion 34 of the second connector member 26. Alternatively, both tabs 60, 61 may be simultaneously pressed. The first end 48 of the second spring 42 unloads which causes the second connector member 26 to rotate out of the locked position. The first and second bracket members 24, 26 are then rotated through the intermediate position to the insertion position. This may be accomplished by a technician manually moving the first handle portion 30 in a upward direction away from the bracket member 18 and manually moving the second handle portion 34 in a downward direction away from the bracket member 18. An advantage of this arrangement is that a technician does not have to hold each hook portion 28, 32 in the insertion position to follow the circuit board assembly 12 to be removed from the electronic chassis 14. Moreover, no tools are required to remove the circuit board assembly 12 from the electronic chassis 14. As a result, a technician can easily and quickly remove the circuit board assembly 12 in an efficient manner.

As shown in FIGS. 3 and 5, the bracket member 18 includes an outer surface 70 and an inner surface 72. A gasket 74 is longitudinally oriented along the outer surface 70 of the bracket member 18. The gasket 74 may preferably be comprised of any metallic material that prohibits the transmission of electromagnetic emissions.

As shown in FIGS. 2, 3 and 5, a first pin 76 extends from the inner surface 72 adjacent the first end 30 of the bracket member 18. A second pin 78 (as shown in FIG. 2) also extends from the inner surface 72 adjacent the second end 22, and is aligned with the first pin 76. As shown in FIGS. 2 and 5, the first and second pins 76, 78 each may preferably include a tapered end portion 80. Each of the first and second pins 76, 78 may preferably be approximately 0.125 inches in diameter and 0.400 inches in length. The first and second pins 76, 78 may each be comprised of steel, aluminum, or any other appropriate rigid metallic material. Each of the first and second pins 76, 78 may preferably be spot welded to the bracket member 18, or in the alternative, may be fastened to the bracket member 18 with conventional fastening components such as, for example, screws, rivets or bolts. Alternatively, the first and second pins 76, 78 may preferably be integrally formed in the bracket member 18. As shown in FIGS. 2 and 3, the top flange 15 of the electronic chassis 14 includes a plurality of equally spaced apart top flange openings 82. The top flange openings 82 each may preferably be comprised of a slot, although various shapes and configurations are contemplated. The bottom flange 17 of the electronic chassis 14 includes a plurality of bottom flange openings 84. Each of the bottom flange openings 84 may also preferably be comprised of a slot, although various shapes and configurations are contemplated.

When the circuit board 16 of the circuit board assembly 12 is inserted into the electronic chassis 14, the first pin 76 is aligned with one of the top flange openings 82 and the second pin 78 is aligned with one of the bottom flange openings 84 that is vertically aligned with the top flange opening. When the bracket member 18 is positioned into close proximity with the electronic chassis 14, the tapered end portion of the first pin 76 extends through the top flange opening and the tapered end portion of the second pin 78 extends; through the bottom flange opening. As the bracket member 18 continues to be moved in a direction toward the electronic chassis 14, the pins 76, 78 automatically and continuously adjusts the position of the bracket member 113 so that when the first and second connector members 24, 26 reach the locked position, the bracket member 18 is properly aligned. The advantage of this arrangement is that the bracket member 18 is properly aligned both vertically and horizontally as the circuit board 16 is being inserted into the chassis 14, which ensures that the insertion and extraction force for each circuit board assembly mounted in the electronic chassis 14 is uniform. As a result, the desired number of assemblies can be easily inserted into the chassis 14.

FIGS. 1–5 show a second circuit board assembly 90 adjacent to the circuit board assembly 12. The second circuit board assembly 90 preferably has the same configuration of the first circuit board assembly 12. As a result, the second circuit board assembly 90 includes a circuit board 92 operatively attached to a bracket member 94. The bracket member 94 includes a first end 96 and a second end 98. The bracket member 94 further includes an outer surface 100 and an inner surface 102. The bracket member 94 further includes a gasket 104 longitudinally oriented along a length of the outer surface 100. The gasket 104 may preferably be comprised of any metallic material that prohibits the transmission of electromagnetic emissions.

As shown in FIGS. 2, 3, and 5, a first pin 106 extends from the inner surface 102 adjacent the first end 96. A second pin 108 (shown in FIG. 2) extends from the inner surface 102 adjacent the second end 90, and is vertically aligned with the first pin 106. As shown in FIG. 5, the first and second pins 106, 108 each may preferably include a tapered end portion 107. Each of the first and second pins 106, 108 may preferably be approximately 0.125 inches in diameter and 0.400 inches in length. The first and second pins 106, 108 may each be comprised of steel, aluminum, or any other appropriate rigid metallic material. Each of the first and second pins 106, 108 may preferably be spot welded to the bracket member 94, or in the alternative, may be fastened to the bracket member 94 with conventional fastening components such as, for example, screws, rivets or bolts. Alternatively, the first and second pins 106, 108 may preferably be integrally formed in the bracket member 94.

When the circuit board 92 of the second circuit board assembly 90 is inserted into the electronic chassis 14, the first pin 106 is aligned with a top flange opening 82 that is adjacent to the opening that received pin 76. The second pin 108 is aligned with a bottom flange opening 84 that is adjacent to the opening that received pin 78. The tapered portion of the first pin 106 extends through the top flange opening and the tapered portion of the second pin 108 extends through the bottom flange opening. The gasket 74 of the bracket member 18 contacts with the outer surface 100 of the bracket member 94. As the bracket member 94 is drawn toward the electronic chassis 14, the outer surface 100 of the bracket member 94 compresses the gasket 74 of the bracket member 18. The pins 106, 108 ensure that second circuit board assembly 90 is properly aligned vertically and horizontally which ensures that there is uniform compression of the gasket 74 along the entire length of the first bracket member 18. The proper amount of gasket compression is critical to ensure uniform electromagnetic interference shielding between the first and second circuit board assemblies 12, 90.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An apparatus for aligning a bracket member of a circuit board assembly as the bracket member is positioned against and secured to an electronic chassis comprising:
    a vertically oriented circuit board assembly including a vertically oriented circuit board operatively attached to a vertically oriented bracket member, the vertically oriented bracket member including a first end and a second end, the vertically oriented bracket member further including an outer surface, an inner surface, and a vertically oriented side wall including a vertically oriented recess formed therein, the vertically oriented recess extending vertically along the vertically oriented side wall from the first end to the second end, a vertically oriented compressible gasket longitudinally oriented along the outer surface of the vertically oriented bracket member and disposed within the vertically oriented recess of the vertically oriented side wall, the vertically oriented compressible gasket extending continuously along the vertically oriented side wall from the first end to the second end, a first pin extending from the inner surface adjacent the first end, a second pin extending from the inner surface adjacent the second end, an electronic chassis including a top flange and a bottom flange, the top flange including a top flange opening and the bottom flange including a bottom flange opening wherein the first pin is aligned with and extends through the top flange opening and the second pin is aligned with and extends through the bottom flange opening to align the vertically oriented bracket member as the vertically oriented bracket member is positioned against and secured to the electronic chassis, at least one connector member rotatably attached to the vertically oriented bracket member, the at least one connector member including a hook portion and a handle portion, the hook portion including a first surface and a second surface oriented at an angle to the first surface, wherein the first surface of the hook portion contacts with a spring to orient the at least one connector member in an insertion position and wherein the second surface of the hook portion contacts the spring to orient the at least one connector member in an intermediate position and a locked position.

2. The apparatus of claim 1 wherein the bracket member is a U-shaped channel member.

3. The apparatus of claim 1 wherein the first and second pins each include a tapered end portion.

4. The apparatus of claim 1 wherein each of the first and second pins is approximately 0.125 inches in diameter and 0.400 inches in length.

5. The apparatus of claim 1 wherein the compressible gasket is comprised of a metallic material that prohibits the transmission of electromagnetic emissions.

6. The apparatus of claim 1 wherein the top flange opening is a lot.

7. The apparatus of claim 1 wherein the bottom flange opening is a slot.

8. An apparatus for providing uniform electromagnetic interference shielding between two adjacent circuit board assemblies comprising:
    a first vertically oriented circuit board assembly including a first vertically oriented circuit board operatively attached to a first vertically oriented bracket member, the first vertically oriented bracket member including a first end and a second end, the first vertically oriented bracket member further including an outer surface, an inner surface, and a vertically oriented side wall including a vertically oriented recess formed therein, the vertically oriented recess extending along the vertically oriented side wall from the first end of the first vertically oriented bracket member to the second end of the first vertically oriented bracket member, the first vertically oriented bracket member including a vertically oriented compressible electromagnetic interference gasket longitudinally oriented along a length of the outer surface of the first vertically oriented bracket member and disposed within the vertically oriented recess of the side wall of the first vertically oriented bracket member, the vertically oriented compressible electromagnetic interference gasket extending continuously along the vertically oriented side wall from the first end of the first vertically oriented bracket member to the second end of the first vertically oriented bracket member, a first pin extending from the inner surface of the first vertically oriented bracket member adjacent the first end of the first vertically oriented bracket member, a second pin extending from the inner surface of the first vertically oriented bracket member adjacent the second end of the first vertically oriented bracket member, at least one connector member rotatably attached to the first vertically oriented bracket member, the at least one connector member including a hook portion and a handle portion, the hook portion including a first surface and a second surface oriented at an angle to the first surface, wherein the first surface of the hook portion contacts with a spring to orient the at least one connector member in an insertion position and wherein the second surface of the hook portion contacts the spring to orient the at least one connector member in an intermediate position and a locked position, a second vertically oriented circuit board assembly including a second vertically oriented circuit board operatively attached to a second vertically oriented bracket member, the second vertically oriented bracket member including a first end and a second end, the second vertically oriented bracket member further including an outer surface, an inner surface, and a vertically oriented side wall including a vertically oriented recess formed therein, the vertically oriented recess of the vertically oriented side wall of the second vertically oriented bracket member extending along the vertically oriented side wall of the second vertically oriented bracket member from the first end of the vertically oriented second bracket member to the second end of the second vertically oriented bracket member, the second vertically oriented bracket member including a vertically oriented compressible electromagnetic interference gasket longitudinally oriented along a length of the outer surface of the second vertically oriented bracket member and disposed within the vertically oriented recess of the vertically oriented side wall of the second vertically oriented bracket member, the vertically oriented compressible electromagnetic interference gasket of the second vertically oriented bracket member extending continuously along the vertically oriented side wall of the second vertically oriented bracket member from the first end of the second vertically oriented bracket member to the second end of the second vertically oriented bracket member, a first pin extending from the inner surface of the second vertically oriented bracket member adjacent the first end of the second vertically oriented bracket member, a second pin extending from the inner surface of the second vertically oriented bracket member adjacent the second end of the second vertically oriented bracket member, an electronic chassis including a top flange and a bottom flange, the top flange including a top flange opening and a second top flange opening, the bottom flange including a bottom flange opening and a second bottom flange opening, wherein the vertically oriented compressible electromagnetic interference gasket of the first vertically oriented bracket member is positioned against the outer surface of the second vertically oriented bracket member and wherein the first pin of the first vertically oriented bracket member is aligned with and extends through the top flange opening and the second pin of the first vertically oriented bracket member is aligned with and extends through the bottom flange opening, the first pin of the second vertically oriented bracket member is aligned with and extends through the second top flange opening and the second pin of the second vertically oriented bracket member is aligned with and extends through the second bottom flange opening to evenly compress the vertically oriented compressible electromagnetic interference gasket of the first vertically oriented bracket member against the second vertically oriented bracket member and provide uniform electromagnetic interference shielding along the length of the first and second vertically oriented bracket members.

9. A method for aligning a bracket member of a circuit board assembly as the bracket member is positioned against and secured to an electronic chassis comprising:

providing a vertically oriented circuit board assembly including a vertically oriented circuit board operatively attached to a vertically oriented bracket member, the vertically oriented bracket member including a first end and a second end, the vertically oriented bracket member further including an outer surface, an inner surface, and a vertically oriented side wall including a vertically oriented recess formed therein, the vertically oriented recess extending along the vertically oriented side wall from the first end to the second end, a vertically oriented compressible gasket longitudinally oriented along the outer surface of the vertically oriented bracket member and disposed within the vertically oriented recess of the vertically oriented side wall, the vertically oriented compressible gasket extending continuously along the vertically oriented side wall from the first end to the second end, a first pin extending from the inner surface adjacent the first end, a second pin extending from the inner surface adjacent the second end, an electronic chassis including a top flange and a bottom flange, the top flange including a top flange opening and this bottom flange including a bottom flange opening, at least one connector member rotatably attached to the vertically oriented bracket member, the at least one connector member including a hook portion and a handle portion, the hook portion including a first surface and a second surface oriented at an angle to the first surface, wherein the first surface of the hook portion contacts with a spring to orient the at least one connector member in an insertion position and wherein the second surface of the hook portion contacts the spring to orient the at least one connector member in an intermediate position and a locked position:

aligning the first pin with the top flange opening;
aligning the second pin with the bottom flange opening;
extending the first pin through the top flange opening;
extending the second pin through the bottom flange opening; and
aligning the vertically oriented bracket member as the vertically oriented bracket member is positioned against and secured to the electronic chassis.

10. A method for providing uniform electromagnetic interference shielding between two adjacent circuit board assemblies comprising:

providing a first vertically oriented circuit board assembly including a first vertically oriented circuit board operatively attached to a first vertically oriented bracket member, the first vertically oriented bracket member including a first end and a second end, the first vertically oriented bracket member further including an outer surface, an inner surface, and a vertically oriented side wall including a vertically oriented recess formed therein, the vertically oriented recess extending along the vertically oriented side wall from the first end of the first vertically oriented bracket member to the second end of the first vertically oriented bracket member, the first vertically oriented bracket member including a vertically oriented compressible electromagnetic interference gasket longitudinally oriented along a length of the outer surface of the first vertically oriented bracket member and disposed within the vertically oriented recess of the vertically oriented side wall of the first vertically oriented bracket member, the vertically oriented compressible electromagnetic interference gasket of the first vertically oriented bracket member extending continuously along the vertically oriented side wall from the first end of the first vertically oriented bracket member to the second end of the first vertically oriented bracket member, a first pin extending from the inner surface of the first vertically oriented bracket member adjacent the first end of the first vertically oriented bracket member, a second pin extending from the inner surface of the first vertically oriented bracket member adjacent the second end of the first vertically oriented bracket member, at least one connector member rotatably attached to the first vertically oriented bracket member, the at least one connector member including a hook portion and a handle portion, the hook portion including a first surface and a second surface oriented at an angle to the first surface, wherein the first surface of the hook portion contacts with a spring to orient the at least one connector member in an insertion position and wherein the second surface of the hook portion contacts the spring to orient the at least one connector member in an intermediate position and a locked position, a second vertically oriented circuit board assembly including a second vertically oriented circuit board operatively attached to a second vertically oriented bracket member, the second vertically oriented bracket member including a first end and a second end, the second vertically oriented bracket member further including an outer surface, an inner surface, and a vertically oriented side wall including a vertically oriented recess formed therein, the vertically oriented recess of the vertically oriented side wall of the second vertically oriented bracket member extending along the vertically oriented side wall of the second vertically oriented bracket member from the first end of second vertically oriented bracket member to the second end of the second vertically oriented bracket member, the second vertically oriented bracket member including a vertically oriented compressible electromagnetic interference gasket longitudinally oriented along a length of the outer surface of the second vertically oriented bracket member and disposed within the vertically oriented recess of the vertically oriented side wall of the second vertically oriented bracket member, the vertically oriented compressible electromagnetic interference gasket of the second vertically oriented bracket member extending continuously along the vertically oriented side wall of the second vertically oriented bracket member from the first end of the second vertically oriented bracket member to the second end of the second vertically oriented bracket member, a first pin extending from the inner surface of the second vertically oriented bracket member adjacent the first end of the second vertically oriented bracket member, a second pin extending from the inner surface of the second vertically oriented bracket member adjacent the second end of the second vertically oriented bracket member, an electronic chassis including a top flange and a bottom flange, the top flange including a top flange opening and a second top flange opening, the bottom flange including a bottom flange opening and a second bottom flange opening;

contacting the vertically oriented compressible electromagnetic interference gasket of the first vertically oriented bracket member with the outer surface of the second vertically Oriented bracket member;

aligning the first pin of the first vertically oriented bracket member with top flange opening;

aligning the second pin of the first vertically oriented bracket member with the bottom flange opening;

extending the first pin of the first vertically oriented bracket member through the top flange opening;

extending the second pin of the first vertically oriented bracket member through the bottom flange opening;

aligning the first pin of the second vertically oriented bracket member with the second top flange opening;

aligning the second pin of the second vertically oriented bracket member with the second bottom flange opening;

extending the first pin of second vertically oriented bracket member through the second flange opening;

extending the second pin of the second vertically oriented bracket member through the second bottom flange;

compressing the vertically oriented compressible electromagnetic interference gasket of the first vertically oriented bracket member with the outer surface of the second vertically oriented bracket member; and providing uniform electromagnetic interference shielding along the length of the first and second vertically oriented bracket members.

* * * * *